(12) United States Patent
Chiu et al.

(10) Patent No.: US 7,364,998 B2
(45) Date of Patent: Apr. 29, 2008

(54) METHOD FOR FORMING HIGH RELIABILITY BUMP STRUCTURE

(75) Inventors: Sung-Cheng Chiu, Hsinchu (TW); Hao-Yi Tsai, Hsinchu (TW); Hsiu-Mei Yu, Hsinchu (TW); Shih-Ming Chen, Miaoli (TW); Shang-Yun Hou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 349 days.

(21) Appl. No.: 11/185,819

(22) Filed: Jul. 21, 2005

(65) Prior Publication Data

US 2007/0020906 A1 Jan. 25, 2007

(51) Int. Cl.
*H01L 21/44* (2006.01)
*H01L 23/48* (2006.01)
*H01L 23/52* (2006.01)
*H01L 29/40* (2006.01)

(52) U.S. Cl. .............. 438/597; 438/613; 438/611; 257/737; 257/738; 257/E21.508; 257/E23.021

(58) Field of Classification Search .......... 257/737, 257/E21.508, E23.021; 438/695, 597
See application file for complete search history.

(56) References Cited

U.S. PATENT DOCUMENTS 5,492,235 A * 2/1996 Crafts et al. .......... 438/695

| | | | |
|---|---|---|---|
| 2002/0096764 A1* | 7/2002 | Huang .......... | 257/737 |
| 2002/0111009 A1* | 8/2002 | Huang et al. ...... | 438/613 |
| 2004/0070042 A1* | 4/2004 | Lee et al. .......... | 257/459 |
| 2007/0132095 A1* | 6/2007 | Marsanne et al. .... | 257/734 |

* cited by examiner

*Primary Examiner*—B. William Baumeister
*Assistant Examiner*—Igwe U. Anya
(74) *Attorney, Agent, or Firm*—Birch, Stewart, Kolasch & Birch, LLP

(57) ABSTRACT

Methods for forming a bump on a semiconductor substrate, the substrate having a contact pad thereon, is provided. In one embodiment, the method comprises depositing a passivation layer over the substrate and the contact pad. The passivation layer is patterned and etched to form a plurality of openings in the passivation layer exposing portions of the contact pad. An under bump metallurgy (UBM) layer is deposited over the etched passivation layer and in the plurality of openings thereof to contact the contact pad. A photoresist layer is formed on the UBM layer and then patterned and etched to form at least one opening substantially overlying the contact pad. An electrically conductive material is deposited into the opening formed in the photoresist layer and overlying the UBM layer and aligned with the contact pad. A portion of the remaining photoresist layer is removed. The UBM layer is etched using the electrically conductive material as a mask. Thereafter, the electrically conductive material is reflowed to provide a bump on the semiconductor substrate.

12 Claims, 10 Drawing Sheets

METHOD FOR FORMING HIGH RELIABILITY BUMP STRUCTURE

BACKGROUND OF THE INVENTION

1. Field of the Invention

The present invention relates generally to the fabrication of solder bumps for the interconnection of semiconductor devices, and more particularly, to under bump metallurgy (UBM) layers that have improved adhesion properties.

2. Brief Discussion of the Related Art

As semiconductor device sizes have decreased, the density of devices on a chip has increased along with the size of the chip thereby making chip bonding more challenging. One of the major problems leading to package failure as chip sizes increase is the increasing difficult problem of coefficient of thermal expansion (CTE) mismatches between materials leading to thermal and mechanical stress buildup and consequent failure. For example, in flip chip technology, chip bonding is accomplished by means of solder bumps formed on under bump metallurgy (UBM) layers overlying a chip contact pad. Frequently, improper bonding between the solder bump and the UBM layer lead to a bond that is not sufficiently strong to withstand such stresses resulting in delamination between the solder bump and the UBM layer.

The problem of delamination between the solder bump and the UBM layer is explained with reference to FIG. 1, which shows a cross-sectional view of a conventional flip chip package structure. As shown in FIG. 1, the flip chip structure includes a chip substrate 2 and a plurality of bump structures 5 (only one is shown in FIG. 1). Each bump structure 5 comprises a UBM layer 3 and a bump 1. The active surface of the substrate 2 has a first passivation layer 6 having an opening that exposes a contact pad 8. Contact pad 8 is in contact with a top metal layer 4 of substrate 2. A second passivation layer 10 is formed on contact pad 8 and first passivation layer 6.

UBM layer 3 may be multi-layered and may include layers such as an adhesion layer (not shown), barrier layer (not shown), and a wettable layer (not shown). Conventional UBM layers such as UBM layer 3 are generally flat and because they are flat, the UBM layers may easily peel off or delaminate from the contact pad 8 during thermal and mechanical stress cycles. Hence, the quality of the UBM layers is critical to the reliability and performance of the flip chip structure.

For these reasons and other reasons that will become apparent upon reading the following detailed description, there is a need for an improved bump structure in advanced IC packaging such as flip chip that avoids the reliability and performance problems associated with conventional bump structures.

SUMMARY OF THE INVENTION

The present invention is directed to methods for forming a bump on a semiconductor substrate, the substrate having a contact pad thereon. In one embodiment, the method comprises depositing a passivation layer over the substrate and the contact pad. The passivation layer is patterned and etched to form a plurality of openings in the passivation layer exposing portions of the contact pad. A UBM layer is deposited over the etched passivation layer and in the plurality of openings thereof to contact the contact pad. A photoresist layer is formed on the UBM layer and then patterned and etched to form at least one opening substantially overlying the contact pad. An electrically conductive material is deposited into the opening formed in the photoresist layer and overlying the UBM layer and aligned with the contact pad. A portion of the remaining photoresist layer is removed. The UBM layer is etched using the electrically conductive material as a mask. Thereafter, the electrically conductive material is reflowed to provide a bump on the semiconductor substrate.

In another embodiment for forming a bump on a semiconductor device, the method comprises forming a first passivation layer on the semiconductor device. The first passivation layer is patterned and etched to form a plurality of openings in the first passivation layer. A contact pad layer is formed over the etched first passivation layer. The contact pad layer is patterned and etched to form a contact pad, the contact pad having a plurality of openings therein. A second passivation layer is formed over the first passivation layer and the contact pad. The second passivation layer is patterned and etched to form an opening in the second passivation layer partially exposing a surface of the contact pad. A UBM layer is deposited over the etched second passivation layer and the contact pad, and in the plurality of openings of the contact pad. A photoresist layer is formed on the UBM layer. The photoresist layer is patterned and etched to form at least one opening substantially overlying the contact pad. An electrically conductive material is deposited into the opening formed in the photoresist layer and overlying the UBM layer and aligned with the contact pad. A portion of the remaining photoresist layer is removed. The USM layer is etched using the electrically conductive material as a mask. Thereafter, the electrically conductive material is reflowed to provide a bump on the semiconductor substrate.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following detailed description and the accompanying drawings, which are given by way of illustration only, and thus are not limitative of the present invention, and in which.

DETAILED DESCRIPTION OF THE PREFERRED EMBODIMENTS

In the following description, numerous specific details are set forth to provide a thorough understanding of the present invention. However, one having an ordinary skill in the art will recognize that the invention can be practiced without these specific details. In some instances, well-known processes and structures have not been described in detail to avoid unnecessarily obscuring the present invention.

Reference will now be made in detail to the present preferred embodiments of the present invention, examples of which are illustrated in the accompanying drawings.

Figure 1:
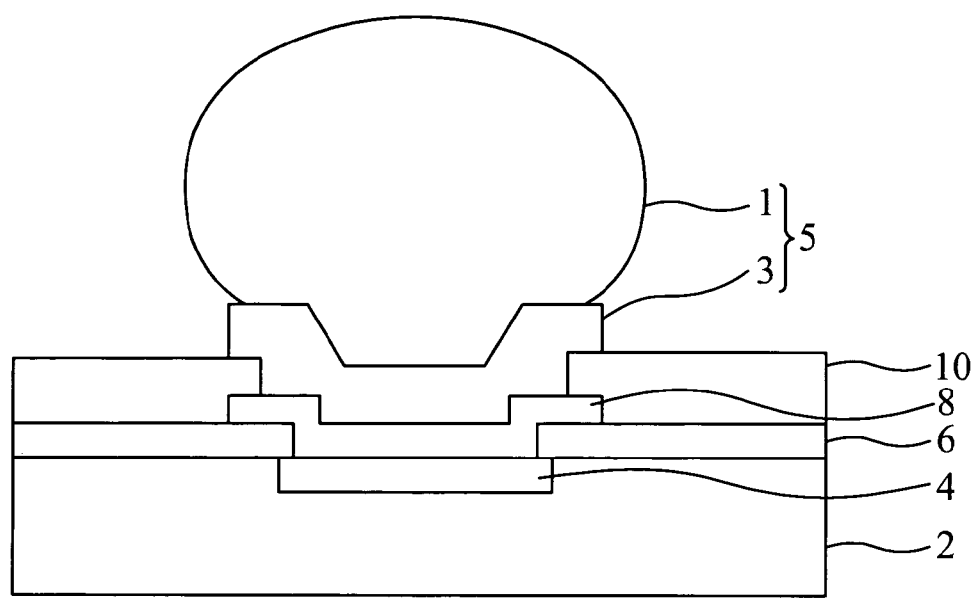
FIG. 1 is a cross-sectional view of a semiconductor device depicting a prior art method of forming a solder bump.
Figure 2:
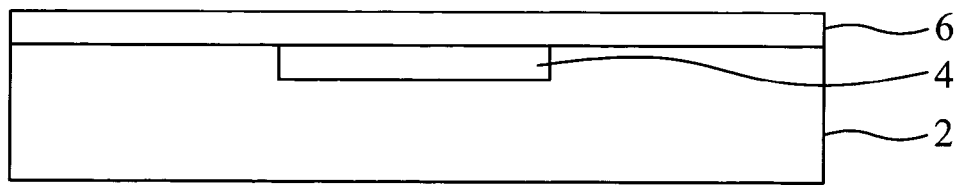
FIGS. 2-11 are cross-sectional views of a semiconductor device depicting a method of forming a solder bump according to one embodiment of the present invention.
Figure 3:
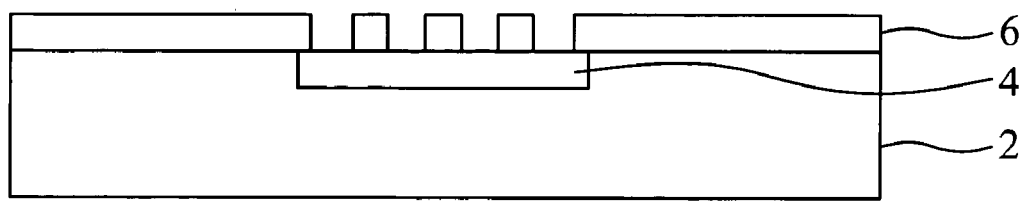
Figure 4:
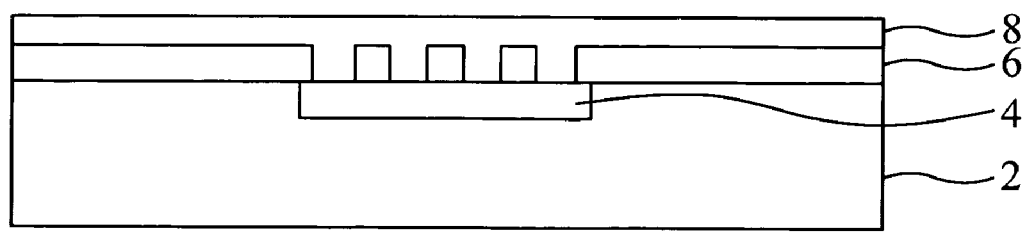

FIGS. 2-11 are cross-sectional views of a semiconductor device depicting a method of forming a solder bump according to one embodiment of the present invention. As shown in FIG. 2, a semiconductor substrate 2 is provided having a top metal layer 4 therein, Substrate 2 is understood to include active and passive devices, conductive layers and dielectric layers and the type of the substrate is a design choice dependent on the fabrication process being employed. A first passivation layer 6 is formed on the surface of substrate 2 and the top metal layer 4. First passivation layer 6, which may be one or more layers, and have a thickness of from about 6,000 Angstroms to about 15,000 Angstroms, may be comprised of a material such as, for example, silicon nitride (SiN), silicon dioxide ($SiO_2$), and silicon oxynitride (SiON) and may be deposited on substrate 2 by conventional deposition methods. First passivation layer 6 is patterned and then etched by conventional photolithography processes to form a plurality of openings therein exposing portions of top metal layer 4, as depicted in FIG. 3. The plurality of openings enable electrical contact to an external circuit to be made from the semiconductor device. Thereafter, as shown in FIG. 4, a contact pad layer 8 is deposited over the etched first passivation layer 6, the contact pad layer 8 being in contact with the top metal layer 4. Contact pad layer 8 may be deposited by any of a variety of conventional deposition methods and have a thickness of from about 6,000 Angstroms to about 15,000 Angstroms. Contact pad layer 8 may be comprised of any of a variety of metals, such as for example, aluminum, aluminum alloys, copper, and copper alloys.

Figure 5:
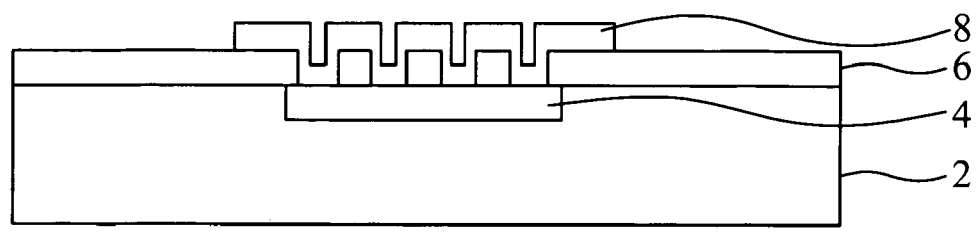

FIG. 5 shows the patterning and etching of the contact pad layer 8 to form a contact pad 8 substantially overlying the top metal layer 4, the contact pad 8 having a plurality of openings therein. As will be understood below, the openings in contact pad 8 form the foundation upon which a novel under bump metallurgy layer rests on and these openings will provide the UBM layer the structural support so critical to the reliability and performance of the device during thermal and mechanical stress cycles.

Contact pad 8 establishes electrical contact between the top metal layer 4 in substrate 2 and a later to be formed overlying solder bump.

Figure 6:
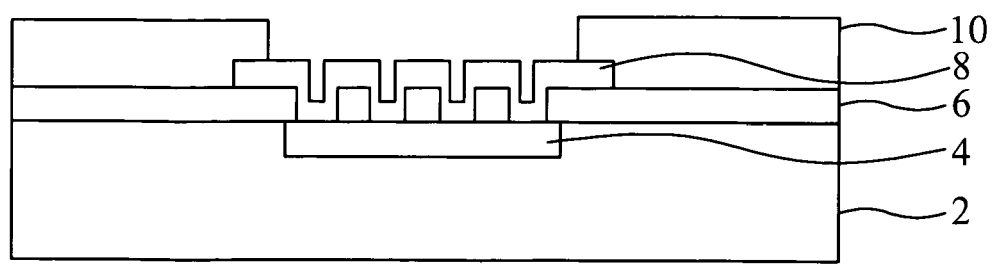

A second passivation layer 10 is formed over the first passivation layer 6 and the contact pad 8 as shown in FIG. 6. Second passivation layer 10 may have a thickness of from about 6,000 Angstroms to about 15,000 Angstroms, be comprised of a material such as, for example, silicon nitride (SiN), silicon dioxide ($SiO_2$), and silicon oxynitride (SiON), and may be deposited by conventional deposition methods. The second passivation layer 10 is then patterned and etched by conventional lithography processes to form an opening therein partially exposing a surface of the contact pad 8.

Figure 7:
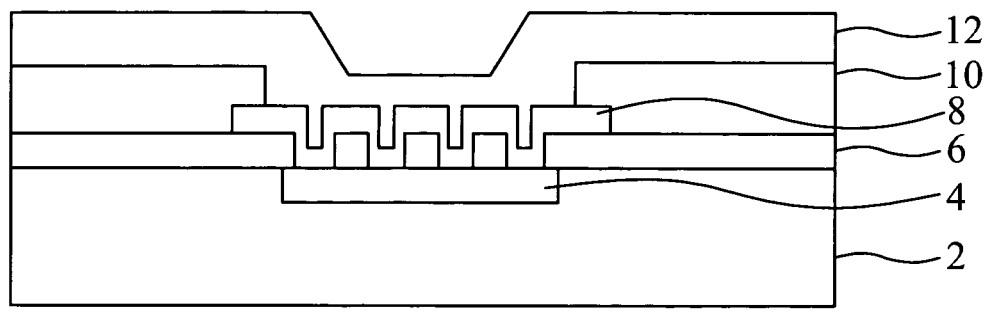

To prepare the semiconductor substrate 2 for solder bumping, typically a cleaning step such as, for example a sputter clean step is next provided. The cleaning step is for protecting the integrated circuits while making good mechanical and electrical contact with a to be formed solder bump. After the cleaning step, a UBM layer is provided over the entire upper surface of the semiconductor wafer and over the upper surface of the contact pad. FIG. 7 shows a UBM layer 12 deposited over the etched second passivation layer 10 and the contact pad 8, and in the plurality of openings of the contact pad 8. UBM layer 12 may be composed of a plurality of individual layers of a variety of different metals and may be deposited by any of a variety of conventional methods including, for example electroless plating, sputtering, or electroplating. As a portion of the UBM layer 12 is deposited in the openings of the contact pad 8, UBM layer 12 is not flat as like conventional UBM layers. Because UBM layer 12 is not flat or substantially flat, UBM layer 12 is not prone to easy peel off or delamination from contact pad 8 during thermal and mechanical stress cycles. Therefore, semiconductor devices having UBM layers of the present invention have better solder bump adhesion thereby improving chip reliability and performance.

UBM layer 12 may comprise of successive layers of metal and in one embodiment, UBM layer 12 may comprise of an adhesion layer (not shown), a wetting layer (not shown), and a protection layer (not shown). The adhesion layer must adhere well to the contact pad 8 and second passivation layer 10, while providing a strong, low-stress mechanical and electrical connection. The wetting layer provides a wettable surface for the molten solder during the solder bumping process, for good bonding of the solder to the underlying metal. The protection layer may be provided to add reliable protection to the underlying layers.

Figure 8:
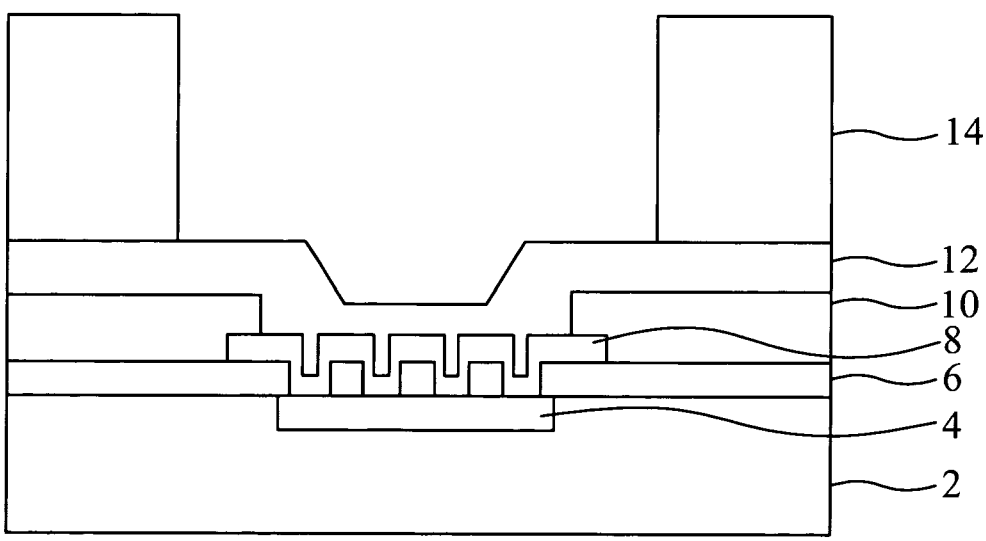
Figure 9:
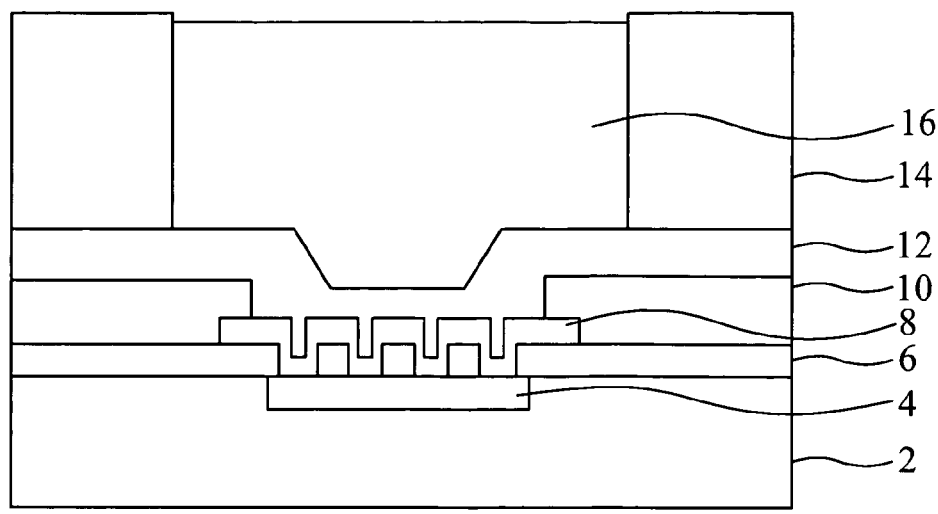
Figure 10:
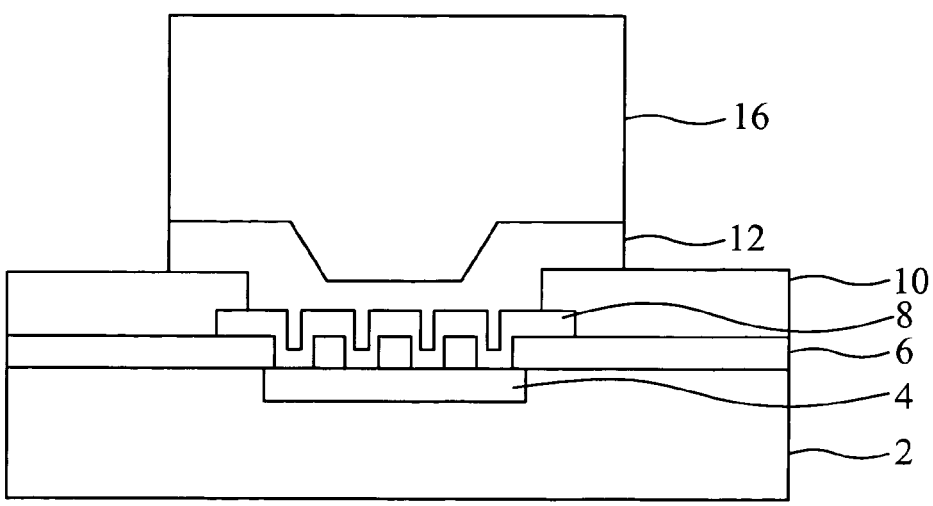
Figure 11:
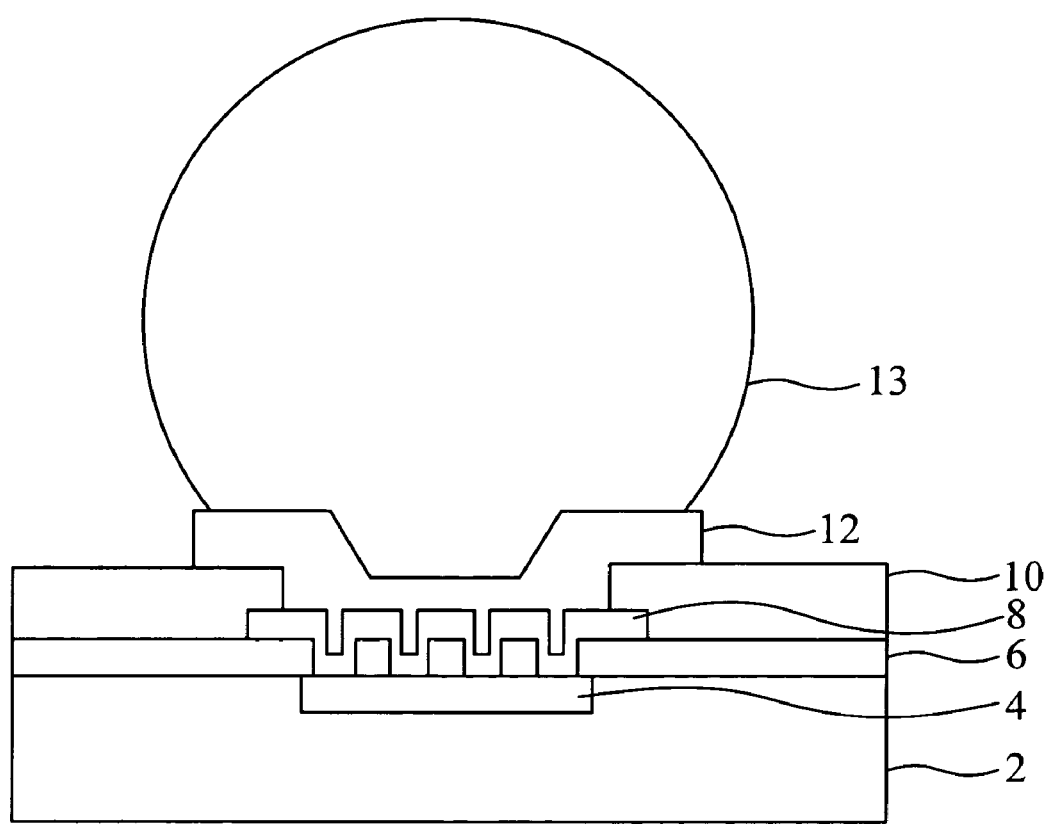

After deposition of UBM layer 12, as shown in FIG. 8, a photoresist layer 14 is formed on the UBM layer 12 and thereafter patterned and etched by conventional photolithography processes to form at least one opening substantially overlying the contact pad 8. In a subsequent process, as shown in FIG. 9, an electrically conductive material 16 may then be deposited into the opening formed in the photoresist layer 14, the electrically conductive material 16 overlying the UBM layer 12 and aligned with the contact pad 8. The electrically conductive material 16 may be deposited by evaporation, electroplating, electroless plating, and screen plating processes. The electrically conductive material 16 may be any of a variety of metals, metal alloys or metals and mixtures of other materials, but preferably, the electrically conductive material is a solder. The solder may be any of a variety of compositions and in one embodiment the solder is in a 63 weight percent Sn, 37 weight percent Pb composition. Following the electrical conductive material deposition, the remaining portions of the photoresist layer 14 are thereafter removed by plasma etching, for example, and UBM layer 12 is etched using the electrically conductive material 16 as an etching mask to form the device shown in FIG. 10. Thereafter, the electrically conductive material 16 (solder) is reflown by heating to form a solder ball or solder bump 13 on the semiconductor device as shown in FIG. 11.

Figure 12:
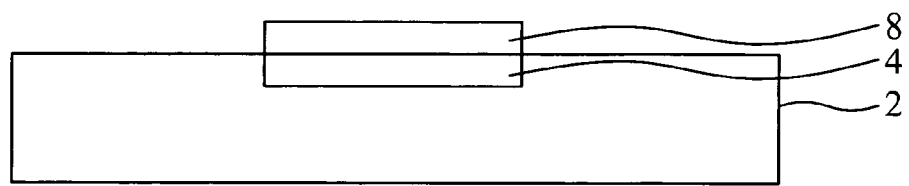
FIGS. 12-19 are cross-sectional views of a semiconductor device depicting a method of forming a solder bump according to another embodiment of the present invention.
Figure 13:
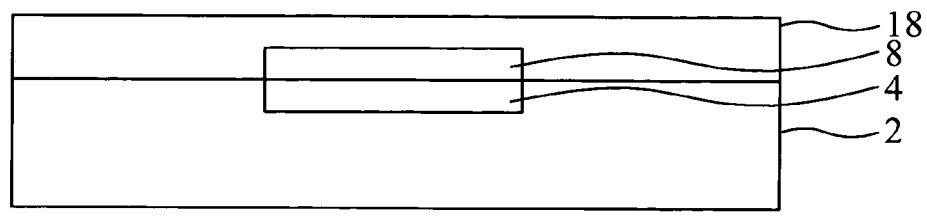
Figure 14:
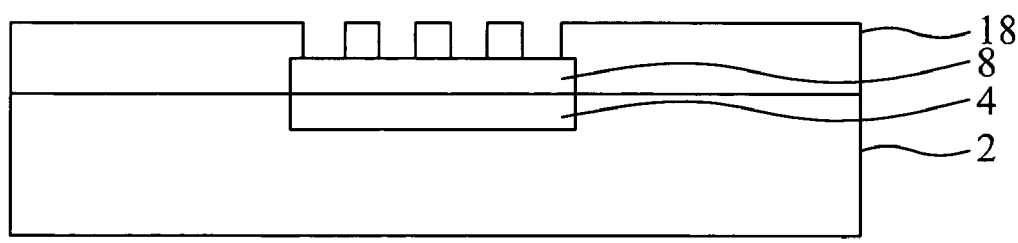

FIGS. 12-19 are cross-sectional views of a semiconductor device depicting a method of forming a solder bump according to another embodiment of the present invention. As shown in FIG. 12, a semiconductor substrate 2 is provided having a contact pad 8 thereon, the contact pad 8 being in contact with a top metal layer 4 in substrate 2. Contact pad 8 establishes electrical contact between the top metal layer 4 and a later to be formed overlying solder bump. Substrate 2 is understood to include both active and passive devices, conductive layers and dielectric layers and the type of the substrate is a design choice dependent on the fabrication process being employed. As shown in FIG. 13, a passivation layer 18 is formed over substrate 2 and contact pad 8. Passivation layer 18, which may comprise of one or more layers, and have a thickness of from about 6,000 Angstroms to about 15,000 Angstroms, may be comprised of a material such as, for example, silicon nitride (SiN), silicon dioxide ($SiO_2$), and silicon oxynitride (SiON) and may be deposited on substrate 2 and contact pad 8 by conventional deposition processes. Passivation layer 18 is patterned and then etched by conventional photolithography processes to form a plurality of openings therein that exposes portions of contact pad 8, as depicted in FIG. 14. The plurality of openings enable electrical contact to an external circuit to be made from the semiconductor device. Also, as will be understood below, the openings in passivation layer 18 form the foundation upon which a novel UBM layer rests on and these openings will provide the UBM layer the structural support so critical to the reliability and performance of the semiconductor device during thermal and mechanical stress cycles.

Figure 15:
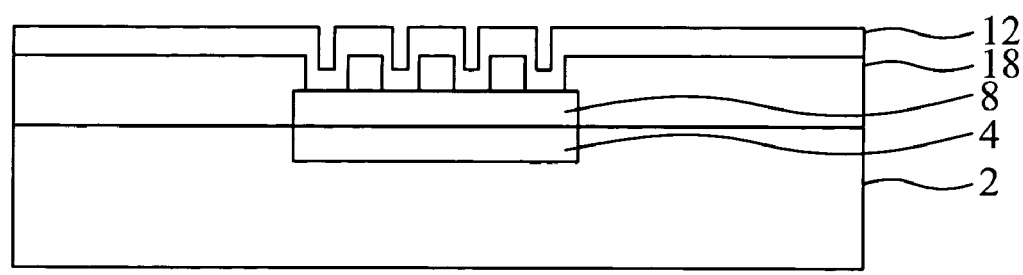

To prepare the semiconductor substrate 2 for solder bumping, typically a cleaning step such as, for example a sputter clean step is provided. The cleaning step is for protecting the integrated circuits while making good mechanical and electrical contact with a to be formed solder bump. After the cleaning step, as shown in FIG. 15, a UBM layer 12 is deposited on the etched passivation layer 18 and in the plurality of openings thereof to contact the contact pad 8. UBM layer 12 may be composed of a plurality of individual layers of a variety of different metals and may be deposited by any of a variety of conventional methods including, for example electroless plating, sputtering, or electroplating.

As a portion of the UBM layer 12 is deposited in the openings of the passivation layer 18, UBM layer 12 is not flat or substantially flat as like conventional UBM layers. Because UBM layer 12 is not flat or substantially flat, UBM layer 12 is not prone to easy peel off or delamination from contact pad 8 during thermal and mechanical stresses. Therefore, semiconductor devices having UBM layers of the present invention have better solder bump adhesion thereby improving chip reliability and overall performance.

UBM layer 12 may comprise of successive layers of metal and in one embodiment, UBM layer 12 may comprise of an adhesion layer (not shown), a wetting layer (not shown), and a protection layer (also not shown). The adhesion layer must adhere well to the contact pad 8 and the passivation layer 18, while providing a strong, low-stress mechanical and electrical connection. The wetting layer provides a wettable surface for the molten solder during the solder bumping process, for good bonding of the solder to the underlying metal. The protection layer may be provided to add reliable protection to the underlying layers.

Figure 16:
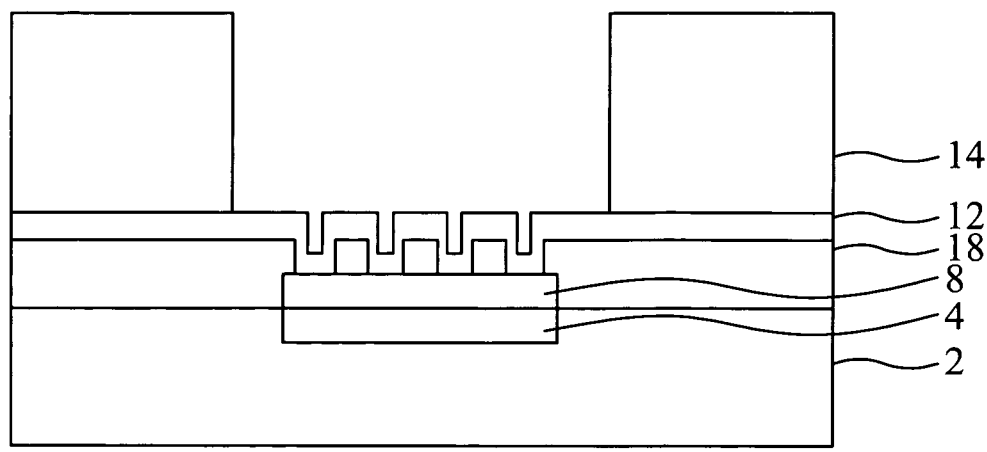
Figure 17:
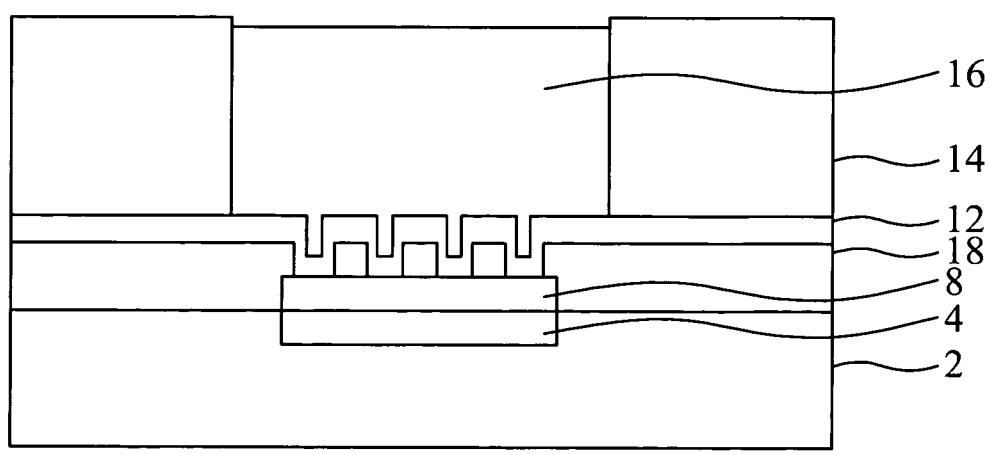
Figure 18:
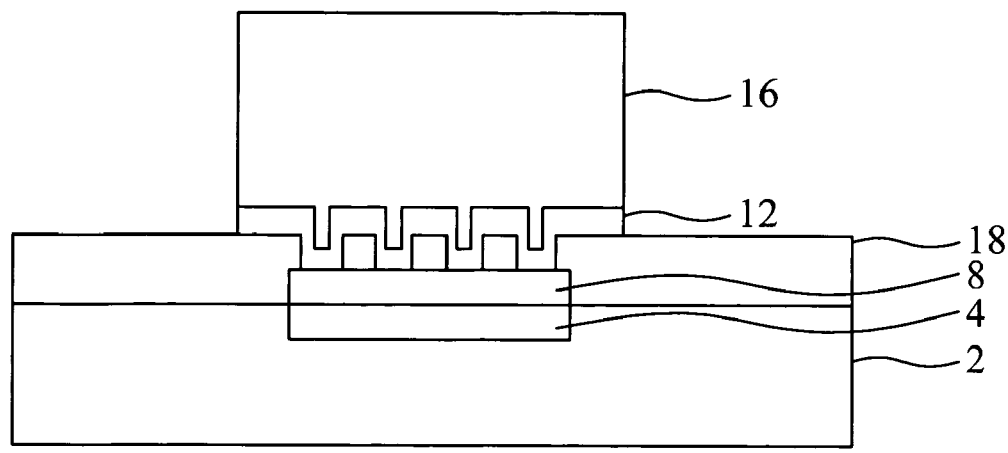
Figure 19:
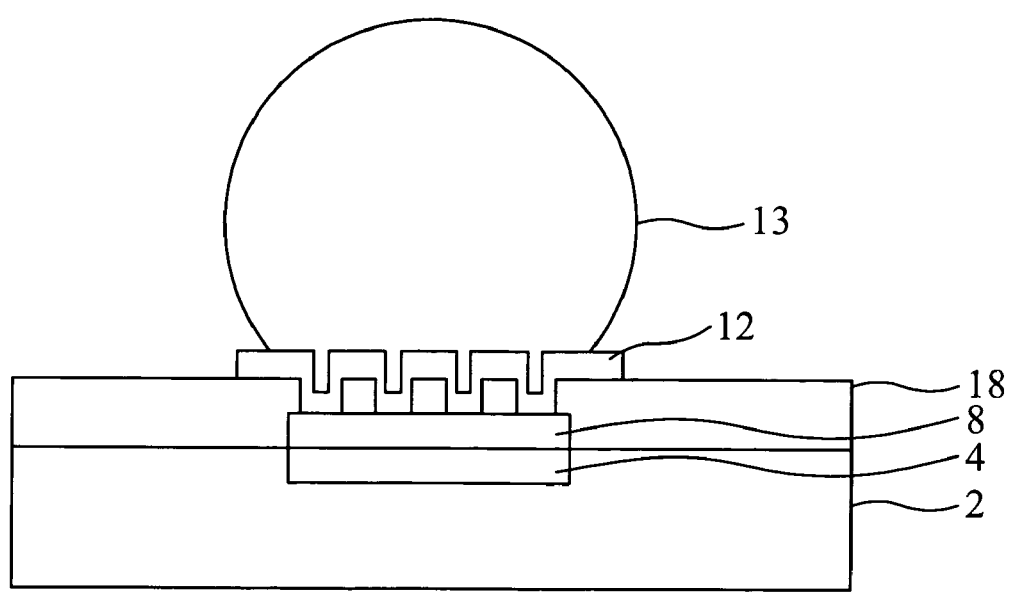

After deposition of UBM layer 12, as shown in FIG. 16, a photoresist layer 14 is formed on the UBM layer 12 and thereafter patterned and etched by conventional photolithography processes to form at least one opening substantially overlying the contact pad 8. In a subsequent process, as shown in FIG. 17, an electrically conductive material 16 may then be deposited into the opening formed in the photoresist layer 14, the electrically conductive material 16 overlying the UBM layer 12 and aligned with contact pad 8. The electrically conductive material 16 may be deposited by evaporation, electroplating, electroless plating, and screen plating processes. The electrically conductive material 16 may be any of a variety of metals, metal alloys or metals and mixtures of other materials, but preferably, the electrically conductive material is a solder. The solder may be any of a variety of compositions and in one embodiment the solder is in a 63 weight percent Sn, 37 weight percent Pb composition. Following the electrically conductive material deposition, the remaining portions of the photoresist layer 14 are thereafter removed by plasma etching, for example, and UBM layer 12 is etched using the electrically conductive material 16 as an etching mask to form the device shown in FIG. 18. Thereafter, the electrically conductive material 16 (solder) is reflown by heating to form a solder ball or solder bump 13 on the semiconductor device as shown in FIG. 19.

In the preceding detailed description, the present invention is described with reference to specifically exemplary embodiments thereof. It will, however, be evident that various modifications, processes, structures, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method for forming a bump on a semiconductor device, comprising:
   forming a first passivation layer on the semiconductor device;
   patterning and etching the first passivation layer to form a plurality of openings in the first passivation layer;
   forming a contact pad layer over the etched first passivation layer;
   patterning and etching the contact pad layer to form a contact pad, the contact pad having a plurality of openings therein;
   forming a second passivation layer over the first passivation layer and the contact pad;
   patterning and etching the second passivation layer to form an opening in the second passivation layer partially exposing a surface of the contact pad; and
   depositing a UBM (Under Bump Metallurgy) layer over the etched second passivation layer and the contact pad, and in the plurality of openings of the contact pad.

2. The method of claim 1, further comprising:
   forming a photoresist layer on the UBM layer; and
   patterning and etching the photoresist layer to form at least one opening substantially overlying the contact pad.

3. The method of claim 2, further comprising:
   depositing an electrically conductive material into the opening formed in the photoresist layer and overlying the UBM layer and aligned with the contact pad;
   removing the remaining portion of the photoresist layer;
   etching the UBM layer using the electrically conductive material as a mask; and
   reflowing the electrically conductive material to provide a bump on the semiconductor device.

4. The method of claim 1, wherein the UBM layer comprises:
   one or more layers of different metallic composition.

5. The method of claim 1, wherein the UBM layer comprises:
   an adhesion layer;
   a wetting layer formed above the adhesion layer; and
   a protection layer formed above the wetting layer.

6. A method for forming a bump on a semiconductor device having a top metal layer therein, the method comprising:
   forming a first passivation layer on the semiconductor device;
   patterning and etching the first passivation layer to form a plurality of openings in the first passivation layer exposing portions of the top metal layer;

forming a contact pad layer over the etched first passivation layer, the contact pad layer being in contact with the top metal layer;

patterning and etching the contact pad layer to form a contact pad substantially overlying the top metal layer, the contact pad having a plurality of openings therein;

forming a second passivation layer over the first passivation layer and the contact pad;

patterning and etching the second passivation layer to form an opening in the second passivation layer partially exposing a surface of the contact pad; and depositing a UBM (Under Bump Metallurgy) layer over the etched second passivation layer and the contact pad, and in the plurality of openings of the contact pad.

7. The method of claim 6, further comprising:

forming a photoresist layer on the UBM layer; and patterning and etching the photoresist layer to form at least one opening substantially overlying the contact pad.

8. The method of claim 7, further comprising:

depositing an electrically conductive material into the opening formed in the photoresist layer and overlying the UBM layer and aligned with the contact pad;

removing the remaining portion of the photoresist layer;

etching the UBM layer using the electrically conductive material as a mask; and reflowing the electrically conductive material to provide a bump on the semiconductor device.

9. The method of claim 6, wherein the UBM layer comprises:

an adhesion layer;

a wetting layer formed above the adhesion layer; and a protection layer formed above the wetting layer.

10. A bump structure on a semiconductor substrate, comprising:

a semiconductor substrate having a top metal layer formed therein;

a patterned and etched first passivation layer formed on the substrate, the first passivation layer having a plurality of openings exposing portions of the top metal layer;

a contact pad formed over the plurality of openings of the first passivation layer, the contact pad having a plurality of openings therein;

a patterned and etched second passivation layer formed over the first passivation layer and the contact pad, the second passivation layer having an opening therein exposing a surface of the contact pad; and a patterned and etched UBM (Under Bump Metallurgy) layer formed over portions of the etched second passivation layer and the contact pad, and in the plurality of openings of the contact pad.

11. The bump structure of claim 10, further comprising:

a bump formed on the etched UBM layer.

12. The bump structure of claim 10, wherein the UBM layer comprises:

an adhesion layer;

a wetting layer formed above the adhesion layer; and a protection layer formed above the wetting layer.

* * * * *